United States Patent [19]

Shishikura

[11] Patent Number: 5,319,602

[45] Date of Patent: Jun. 7, 1994

[54] COMBINATION OF A PRINTED WIRING BOARD AND A MEMORY DEVICE SELECTING CIRCUIT

[75] Inventor: Hirohisa Shishikura, Tokyo, Japan

[73] Assignee: Oki Electric Industry Co., Ltd., Tokyo, Japan

[21] Appl. No.: 930,172

[22] Filed: Aug. 17, 1992

[30] Foreign Application Priority Data

Aug. 19, 1991 [JP] Japan .................................. 3-206911

[51] Int. Cl.$^5$ .......................... G11C 5/06; H01L 27/10
[52] U.S. Cl. ............................. 365/230.03; 365/189.03; 365/228; 365/229; 365/226
[58] Field of Search ............... 365/230.03, 189.03, 365/228, 229, 226, 51, 52, 63, 195; 307/38, 39, 40

[56] References Cited

U.S. PATENT DOCUMENTS 4,617,650 10/1986 Morino et al. ..................... 365/195
4,882,700 11/1989 Mauritz et al. ................. 365/189.01

Primary Examiner—Eugene R. LaRoche
Assistant Examiner—Huan Hoang
Attorney, Agent, or Firm—Edward D. Manzo

[57] ABSTRACT

In a combination of a printed wiring board and a memory device selecting circuit provided on the printed wiring board, the printed wiring board is provided with a predetermined number of device mount areas and a conductor pattern for connection with memory devices in the device mount areas. The number of the memory devices actually mounted in the mount areas is set in a device-number setting device, and in accordance with a predetermined bits of address code and on the basis of the number set, device select signals are produced, and are distributed over the conductor pattern. Identical printed wiring boards and memory device selecting circuits can be used, without alteration or re-designing, for forming electronic devices having different memory capacities or different number of memory devices.

6 Claims, 4 Drawing Sheets

| NUMBER OF DEVICES | N1 | N0 | MODIFIED ADDRESS CODE | | |
|---|---|---|---|---|---|
| | | | S2 | S1 | S0 |
| 1 | L | L | 0 | 0 | 0 |
| 2 | L | H | 0 | 0 | AD10 |
| 4 | H | L | 0 | AD11 | AD10 |
| 8 | H | H | AD12 | AD11 | AD10 |

COMBINATION OF A PRINTED WIRING BOARD AND A MEMORY DEVICE SELECTING CIRCUIT

BACKGROUND OF THE INVENTION

The present invention relates to a combination of a printed wiring board and a memory device selecting circuit used for forming an electronic device including one or more data storage more memory devices (integrated circuits) which are mounted on the printed wiring board.

An electronic device, such as a data processing device, often employs a data storage memory module which may comprise a single memory device or a plurality of memory devices. The number of the memory devices is determined on the basis of the required memory capacity. When a plurality of memory devices is mounted, a circuit for selecting one of the memory devices is also provided on the printed wiring board. In the prior art, depending on the number of memory devices that are actually required, the circuit for selecting one of the memory devices needs to be altered or re-designed depending on the number of the memory devices used and the conductor pattern for connection with the memory devices must also be altered or re-designed.

Preparing different kinds of combinations of printed wiring boards and device selecting circuits for different number of memory devices is costly, and this leads to higher overall production costs.

SUMMARY OF THE INVENTION

An object of the invention is to provide a combination of a printed wiring board and a memory device selecting circuit used for forming an electronic device which can be used to form an electronic device without alteration of the device selecting circuit or the conductor pattern on the printed circuit board when the number of the memory devices is varied.

The present invention provides in one of its aspects a combination of a printed wiring board and a memory device selecting circuit provided on the printed wiring board used for forming an electronic device.

Preferably the printed wiring board has a predetermined number of device mount areas each allowing a data storage memory device to be mounted therein, said printed wiring board further having a conductor pattern for connection with the memory device in each of said device mount areas.

Preferably said memory device selecting circuit comprises
a device-number setting device in which the number of the memory devices actually mounted in said mount area is set, and which produces a number-indicating signal indicating the number of the devices that has been set therein; and
device select signal generating circuit which receives a predetermined address bit or bits and said number-indicating signal, and produces device select signals in accordance with an address code and said number-indicating signal.

Preferably, the conductor pattern includes a device select signal conductor pattern for distributing the device select signals to the respective device mount areas.

DETAILED DESCRIPTION OF THE PREFERRED EMBODIMENTS

An embodiment of the invention will now be described with reference to the drawings. In the description of the embodiment, identical reference marks are used for denoting signal lines and the signals transmitted thereover.

Figure 1:
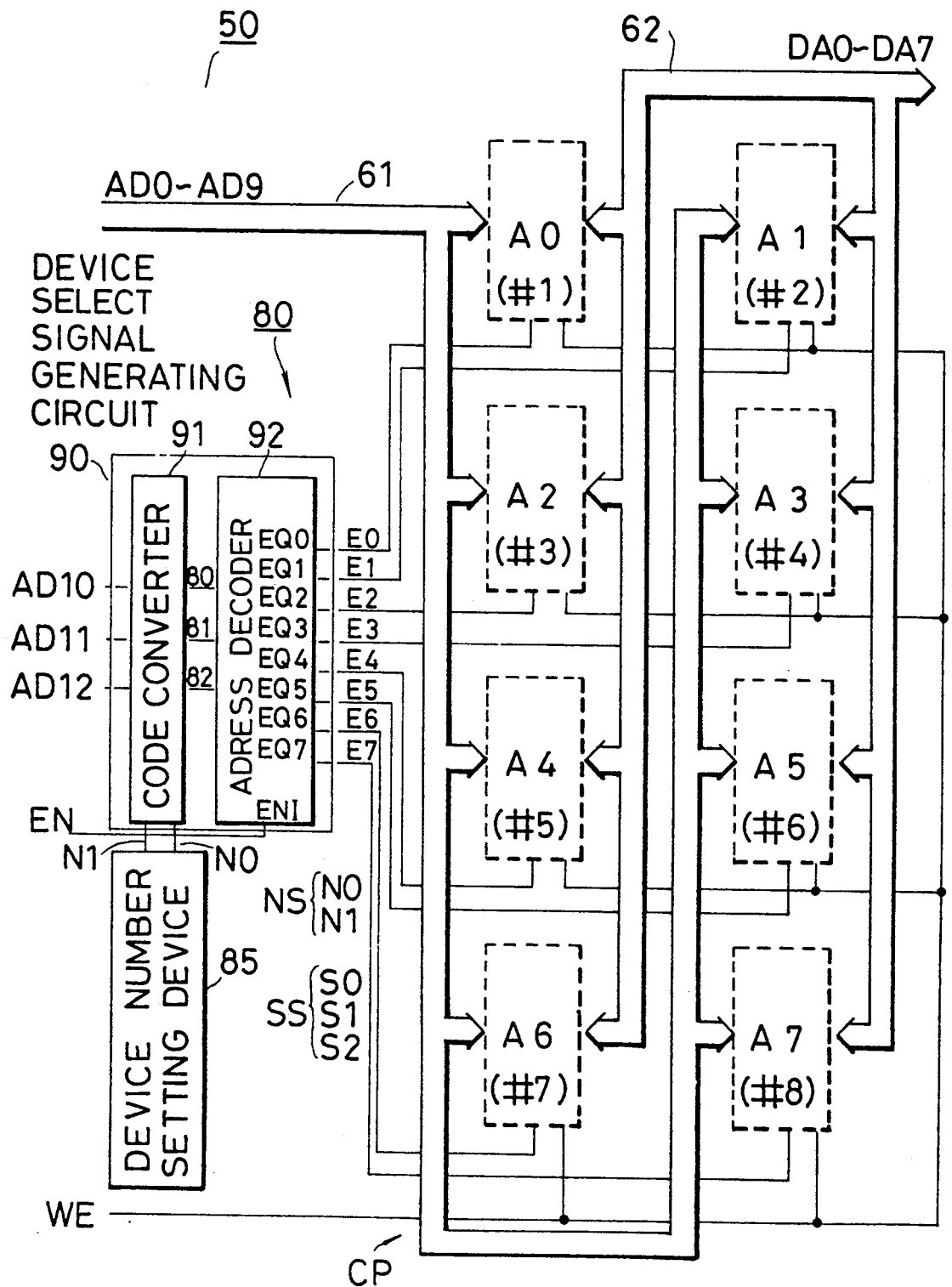
FIG. 1 is a schematic plan view showing a printed wiring board with a memory device selecting circuit in accordance with an embodiment of the invention.

Referring first to FIG. 1, the combination of this embodiment comprises a printed wiring board 50.

Provided on the printed wiring board 50 are a plurality of device mount areas A0 to A7, a printed conductor pattern CP, and a memory device selecting circuit 80.

Figure 2:
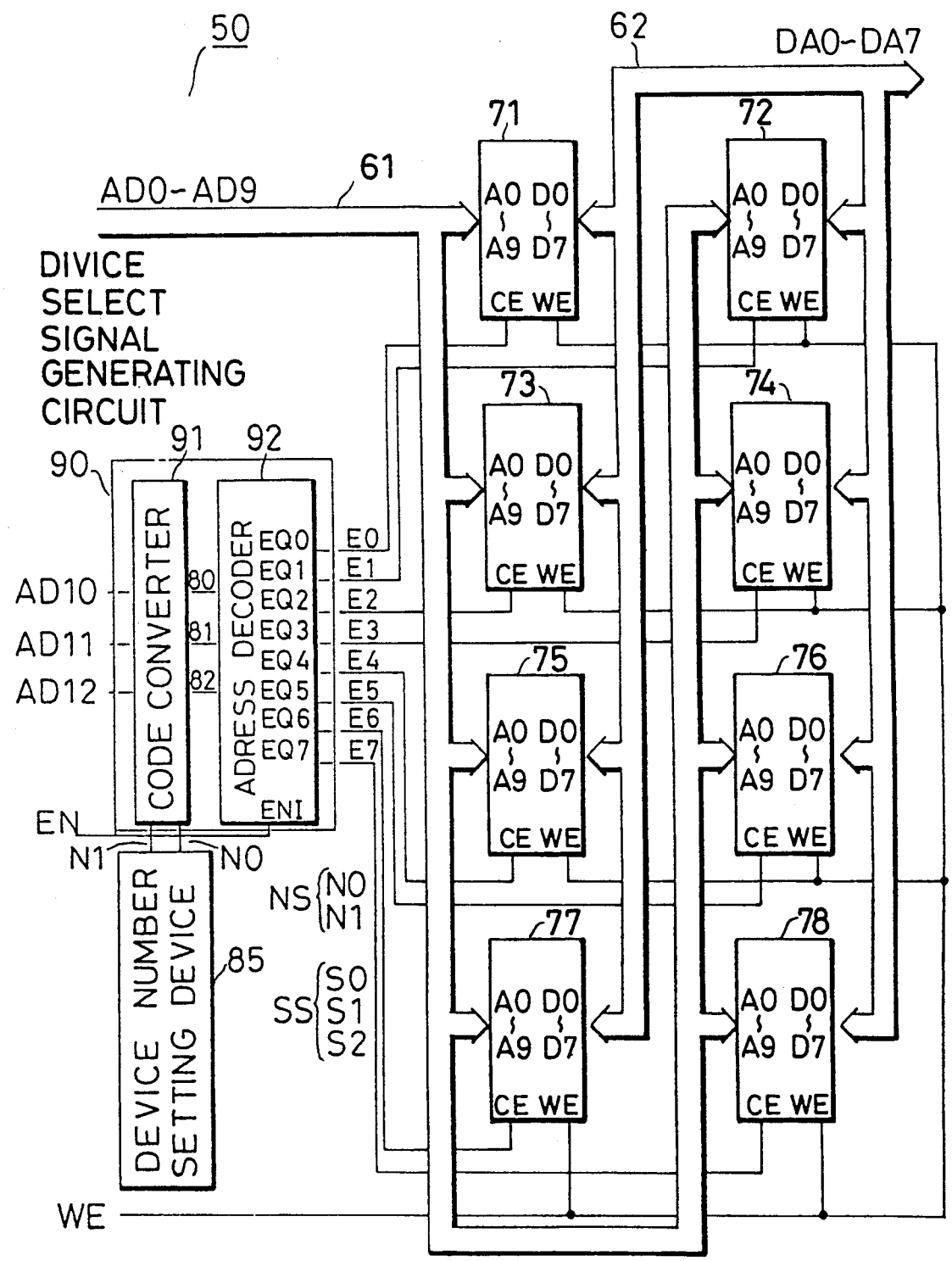
FIG. 2 is a schematic plan view similar to FIG. 1, but also illustrating memory devices mounted in all the eight device mounting areas to be described later.

In the illustrated embodiment, eight device mount areas A0 to A7 are provided, i.e., the number N of the device mount areas is eight. Each of the device mount areas A0 to A7 is for allowing a data storage memory device to be mounted therein. That is, depending on the particular application, specifically depending on the required memory capacity, one or more of the device mount areas are actually used, i.e., memory devices are actually mounted in the allocated device mount areas. FIG. 2 shows a state in which memory devices 71 to 78 are mounted in all of the eight mounting areas A0 to A7.

The printed conductor pattern or wiring pattern CP comprises conductor patterns forming a data bus 62 including address bit lines AD0 to AD9, conductor patterns forming an address bus 61 including data bit lines DA0 to DA7, conductor patterns forming higher address bit lines AD10 to AD12, and the conductor patterns forming control signal lines including device select signal lines E0 to E7, a read/write control signal line WE, an enable signal EN and number-indicating signal lines N0 and N1.

Figure 3:
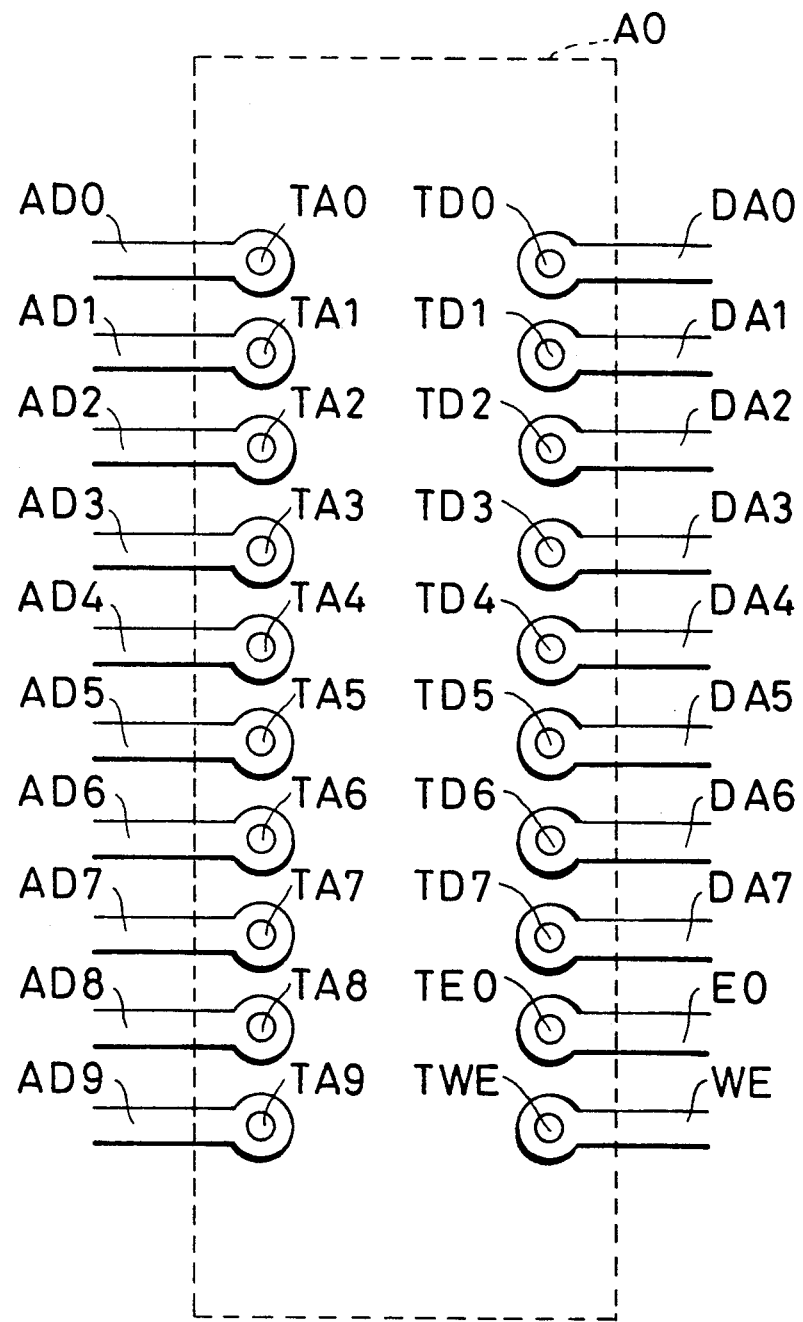
FIG. 3 is a detailed view of part of the printed wiring board shown in FIG. 1.

As is better seen in FIG. 3, the conductor pattern CP is provided with throughholes within or adjacent to the area A0 for connection with the memory device that is actually mounted in the area A0. Specifically, the data bit lines DA0 to DA7 are respectively provided with throughholes TD0 to TD7, and the address bit lines AD0 to AD9 are respectively provided with throughholes TA0 to TA9. Additionally, the device select signal line E0 is provided with a throughhole TE0 and the write/read control signal control signal line WE is provided with a throughhole TWE. These throughholes TA0 to TA7, TD0 to TD9, TE0 and TWE are used for connection with corresponding pins protruding from the device. Conductor pattern for power supply lines, clock signal lines, and their associated throughholes are also provided, but their illustration is omitted.

The conductor pattern CP is also provided with similar throughholes within or adjacent to each of the other device mount areas A2 to A7 for connection with the memory device that is actually mounted in each area. It should however be noted that instead of the device select signal line E0, a corresponding one of the device select signal lines E1 to E7 has a throughhole within or adjacent to each of the areas A1 to A7.

The device selecting circuit 80 is provided on the printed circuit board 50, and is connected as illustrated by the signal lines formed of the conductor patterns, and comprises a device-number setting device 85 and a device select signal generating circuit 90.

The device-number setting device 85 is provided to allow setting of the number of the memory devices actually mounted in the mount areas A0 to A7. The device-number setting device 85 may be in the form of a pair of dip switches whose positions can be set manually to produce a signal representing either "H" or "L".

In accordance with the device number set, the device-number setting device 85 produces a number-indicating signal NS indicating the number of the devices that has been set therein. The number-indicating signal NS is in the form of a code consisting of two bits N0 and N1 transmitted over the signal lines N0 and N1.

The device select signal generating circuit 90 receives address bits AD10 to AD12, which are next higher than the address bits AD0 to AD9 supplied to the memory devices. The device select signal generating circuit 90 also receives the number-indicating signal NS, and produces device select signals (or "chip select signals") E0 to E7 in accordance with the address bits AD10 to AD12 and the number-indicating signal NS. The device select signals E0 to E7 are transmitted tot he respective device mount areas A0 to A7 via the signal lines E0 to E7.

In the illustrated embodiment, the device select signal generating circuit 90 comprises a code converter 91 receiving the address bits AD10 to AD12 and the number-indicating signal NS and converting the address bits AD10 to AD12 in accordance with the number-indicating signal NS to generate a modified address code SS consisting of modified address bits S0 to S2.

The device select signal generating circuit 90 also comprises an address decoder 92 receiving the modified address code SS and the enable signal EN at an enable signal input terminal ENI, and decoding, when the enable signal EN is active, the modified address code SS into the device select signals E0 to E7 one of which is active and the rest of which are inactive. The device select signals E0 to E7 are output via output terminals EQ0 to EQ7 of the address decoder 92.

For the purpose of explanation, the device mount areas A0 to A7 are numbered consecutively, from #1 to #8.

The device select signals E0 to E1 are so produced that when n (n being a number within the range of 1 to 8) memory devices are actually mounted that one of the device select signals distributed to the first to n-th areas (#1 to #n, or A0 to A(n−1) is active, and the rest of the device select signals are inactive. This ensures that when n memory devices are mounted in the first to n-th device mount areas A0 to A(n−1), one of the memory devices is selected by the device select signals.

In the following description, the number of the memory devices mounted in the areas A0 to A7 is assumed to be either 1, 2, 4 or 8.

When the device number n is 1, 2, 4 and 8, the values of the bits N0 and N1 of the number indicating signal output from the device-number setting device 85 are set as follows:

When n=1, N0=L and N1=L

When n=2, N0=H and N1=L
When n=4, N0=L and N1=H
When n=8, N0=H and N1=H

Figures 4, 5:
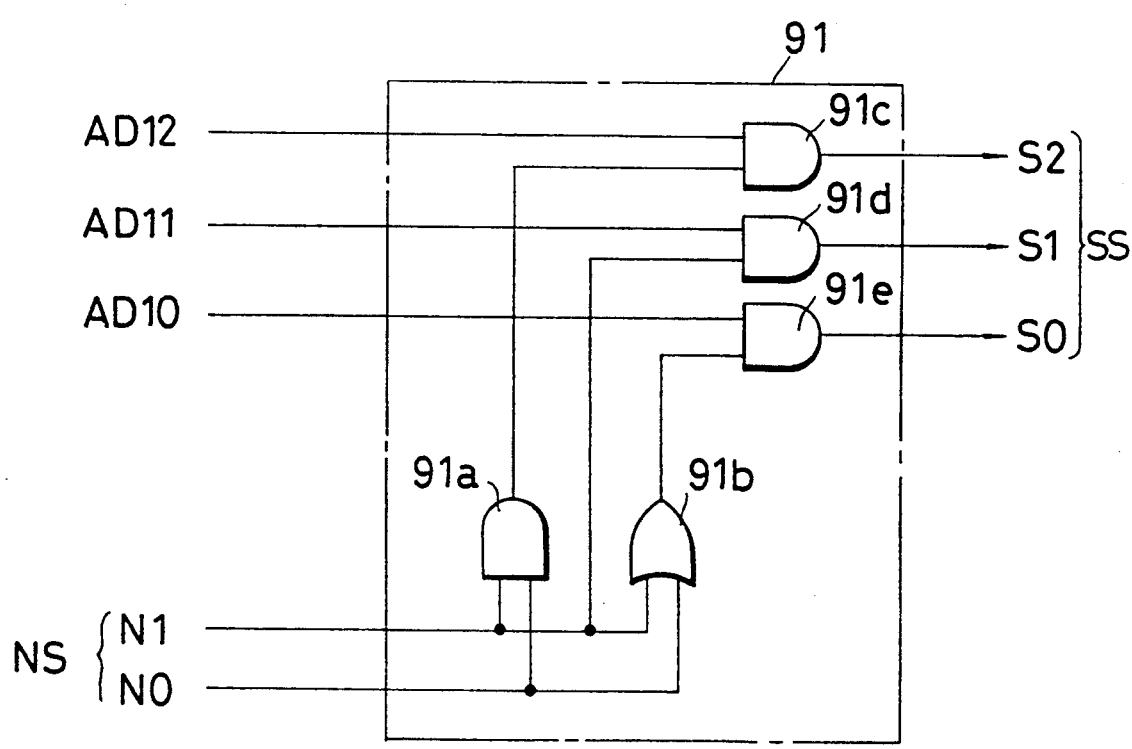
FIG. 4 is a table showing the conversion made at the code converter 91.
FIG. 5 shows an example of code converter for implementing the conversion shown in FIG. 4.

FIG. 4 shows the conversion made at the code converter 91. An example of code converter 91 for implementing the conversion is shown in FIG. 5. As illustrated in the figure, the code converter 91 of this example comprises an AND gate 91a, an OR gate 91b, and further AND gates 91c to 91e.

The AND gate 91a receives the two bits N0 and N1 of the number-indicating signal NS and produces the logical product of them. The OR gate 91b receives the two bits N0 and N1 of the number-indicating signal NS and produces the logical sum of them. The AND gate 91c receives the address bit AD10 and the output of the AND gate 91a and produces the logical product of them. The AND gate 91d receives the address bit AD11 and the bit N1 of the number-indicating signal NS and produces the logical product of them. The AND gate 91e receives the address bit AD12 and the output of the OR gate 91b and produces the logical product of them.

As seen from the table of FIG. 4, when the device number is 1 and N0=L and N1=L, all the bits S0 to S1 of the modified address code SS are 0. When the device number is 2 and N0=H and N1=L, both of the bits S1 and S2 are 0, while S0=AD10. When the device number is 4 and N0=L and N1=H, the bit S2 is 0, while S1=AD11 and S0=AD10. When the device number is 8 and N0=H and N1=H, S2=AD12, S1=AD11 and S0=AD10.

The address decoder 92 takes the modified address code SS as a three-bit number and activates one of the signals E0 to E7 whose suffix (0 to 7) is the decimal number corresponding to the three-bit number. That is: if S2=0, S1=0, S0=0,
 then E0 is active and the rest are all inactive; if S2=0, S1=0, S0=1,
 then E1 is active and the rest are all inactive; if S2=0, S1=1, S0=0,
 then E2 is active and the rest are all inactive; if S2=0, S1=1, S0=1,
 then E3 is active and the rest are all inactive; if S2=1, S1=0, S0=0,
 then E4 is active and the rest are all inactive; if S2=1, S1=0, S0=1,
 then E5 is active and the rest are all inactive; if S2=1, S1=1, S0=0,
 then E6 is active and the rest are all inactive; if S2=1, S1=1, S0=1,
 then E7 is active and the rest are all inactive.

The device select signals E0 to E7 are supplied to device select terminals CE of the respective devices 71 to 78. Each of the devices 71 to 78 is made active (in which reading and writing are enabled) when the device select signal supplied to its terminal CE is also active. That is:
 when E0 alone is active, the device 71 alone is active;
 when E1 alone is active, the device 72 alone is active;
 when E2 alone is active, the device 73 alone is active;
 when E3 alone is active, the device 74 alone is active;
 when E4 alone is active, the device 75 alone is active;
 when E5 alone is active, the device 76 alone is active;
 when E6 alone is active, the device 77 alone is active; and
 when E7 alone is active, the device 78 alone is active.

The control input signal terminal ENI of the address decoder 92 is supplied with the control signal EN. When EN is active, the above described decoding operation is enabled. When EN is active, all the device select signals E0 to E7 are inactive.

Description is made on each of the situations where n=1, 2, 4 and 8, respectively.

n=1

If, in a certain application of the printed wiring board, it is desired that a single memory device is to be mounted, it is mounted in the first area A0 (area #1), and the memory device 71 in FIG. 2 is actually mounted, and the other memory devices 72 to 78 are not mounted. In such an application, "1" is set as the device number in the device-number setting device 85, i.e., both N0 and N1 are set at "L".

In operation, address bits AD0 to AD09 are applied while the address bits AD10 to AD12 are not used. Because N0 and N1 are both L, the modified address bits S2, S1 and S0 are all 0. As a result, E0 alone is active and the other select signals E1 to E7 are all inactive. Accordingly, the memory device 71 is activated.

The address bits AD0 to AD9 applied to the address bit lines AD0 to AD9 are applied to the address input terminals A0 to A9 of the memory device 71.

n=2

If it is desired that two memory devices are to be mounted, they are mounted in the first and second areas A0 and A1 (areas #1 and #2), and the memory devices 71 and 72 in FIG. 2 are actually mounted, and the other memory devices 73 to 78 are not mounted. In such an application, "2" is set as the device number in the device-number setting device 85, that is N0 is set at H and N1 is set at L.

In operation, the address bits AD0 to AD10 are applied while the address bits AD11 and AD12 are not used. Because N0=H and N1=L, S0=AD10 while S2=0 and S1=0. As a result, either E0 or E1 is active depending on the value of S0=AD10, and the other of E0 and E1 as well as E2 to E7 are all inactive. Accordingly, either one of the memory devices 71 and 72 is activated.

The address bits AD0 to AD9 applied to the address bit lines AD0 to AD9 of the address input terminals A0 to A9 of the memory devices 71 and 72.

n=4

If it is desired that four memory devices are to be mounted, they are mounted in the first to fourth areas A0 to A3 (areas #1 to #4), and the memory devices 71 to 74 in FIG. 2 are actually mounted, and the other memory devices 75 to 78 are not mounted. In such an application, "4" is set as the device number in the device-number setting device 85, that is, N0 is set at L and N1 is set at H.

In operation, the address bits AD0 to AD11 are applied while the address bit AD12 is not used. Because N0=L and N1=H, S0=AD10, S1=AD11, while S=0. As a result, one of E0 to E3 is active depending on the values of S0=AD10 and S1=AD11, and the rest of E0 to E3 as well as E4 to E7 are all inactive. Accordingly, one of the memory devices 71 to 74 is activated.

The address bits AD0 to AD9 applied to the address bit lines AD0 to AD9 are applied to the address input terminals A0 to A9 of the memory devices 71 to 74.

n=8

If it is desired that eight memory devices are to be mounted, they are mounted in all the first to eighth areas A0 to A7 (areas #1 to #8), and the memory devices 71 to 78 in FIG. 2 are actually mounted. In such an application, "8" is set as the device number in the device-number setting device 85, that is, N0 and N1 are both set at H.

In operation, the address bits AD0 to AD12 are applied. Because N0=H and N1=H, S0=AD10, S1=AD11, and S2=AD12. As a result, one of E0 to E7 is active depending on the values of S0=AD10, S1=AD11 and S2=AD12, and the rest of E0 to E7 are all inactive. Accordingly, one of the memory devices 71 to 78 is activated.

The address bits AD0 to AD9 applied to the address bit lines AD0 to AD9 are applied to the address input terminals A0 to A9 of the memory devices 71 to 78.

In either of the above cases, n=1 to n=8 data is read from or is written in the memory device activated by the device select signals, and at the memory location addressed by the address bits AD0 to AD9. The data read from the memory device is output via data input-/output terminals D0 to D7 to the data bus 62. The data to be written in the memory device is supplied via the data bus 62 to the data terminals D0 to D7. Either writing or reading is done depending on the value of the write/read control signal WE.

In the above embodiment, the number of device mount areas is eight. But it may be any number other than eight.

In the above embodiment, the device-number setting device 85 comprises dip switches. It may alternatively be formed of any other means which can allow a number to be set and produces a signal representing the number set.

In the above embodiment, the conductor pattern is provided with throughholes for connection with the memory devices. But the conductor pattern may alternatively be provided with bonding pads where the memory devices are of the surface mounting type.

In the above embodiment, the device select signal generating circuit 90 comprises the code converter 91 and the address decoder 92, but it may be formed of a unitary circuit having identical overall function.

As has been described, the printed wiring board according to the invention can be used for the formation of electronic devices having different memory capacities with different number of memory devices, without alteration or re-designing of the conductor pattern on the printed wiring board or the associated circuit. In other words, it is sufficient to provide a single type of printed wiring boards and the memory device circuit for the manufacture of various types of electronic devices requiring different memory capacities. As a result, the cost of manufacture of the electronic devices can be lowered.

What is claimed is:

1. A combination of a printed wiring board and a memory device selecting circuit provided on the printed wiring board used for forming an electronic device;

said printed wiring board having a predetermined number of device mount areas each allowing a data storage memory device to be mounted therein, said printed wiring board further having a conductor pattern for connection with the memory device in each of said device mount areas;

said memory device selecting circuit comprising:

a device-number setting device in which the number of the memory devices actually mounted in said mount area is set, and which produces a number-indicating signal indicating the number of the devices that has been set therein; and a device select signal generating circuit which receives a predetermined address bit or bits and said number-indicating signal, and produces device select signals in accordance with an address code and said number-indicating signal; and said conductor pattern including a device select signal conductor pattern for distributing the device select signals to the respective device mount areas.

2. The combination according to claim 1, wherein said device select signal generating circuit comprises a code converter receiving said predetermined address bit or bits and said number-indicating signal and converting said predetermined address bit or bits in accordance with said number-indicating signal to generate an address code, and an address decoder receiving the address code and decoding it to generate said device select signals.

3. The combination according to claim 1, wherein said device mount areas are numbered consecutively, from 1st to N-th device mount areas, with N being the number of the device mount areas, and said device select signals are produced so that when n (n being a number within the range of 1 to N) memory devices are actually mounted that one of the device select signals distributed to the first to n-th areas is active, whereby when n memory devices are mounted in the first to n-th device mount areas one of the memory devices is selected by said device select signals.

4. The combination according to claim 1, wherein said conductor pattern further comprises conductor patterns for data bus, conductor patterns for address bus and conductor patterns for control signal lines including a read/write control signal line.

5. The combination according to claim 1, wherein said conductor pattern is provided with throughholes within or adjacent to each of the device mount areas for connection with the memory device that is actually mounted.

6. The combination according to claim 1, wherein said predetermined address bit or bits are bit or bits having an order or orders next higher than address bits supplied directly to the memory devices.

* * * * *